Figure 1:
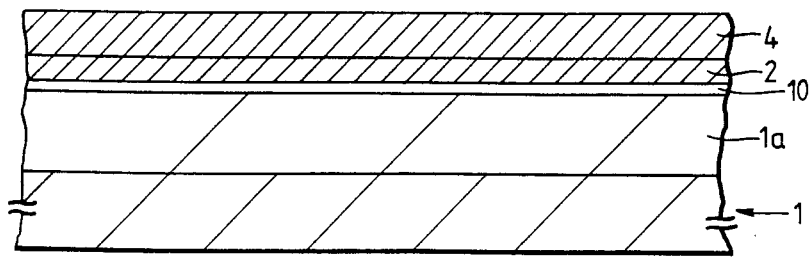

United States Patent [19]

Harris et al.

[11] Patent Number: 4,980,312

[45] Date of Patent: Dec. 25, 1990

[54] METHOD OF MANUFACTURING A SEMICONDUCTOR DEVICE HAVING A MESA STRUCTURE

[75] Inventors: Jeffrey J. Harris; Stephen J. Battersby, both of Haywards Heath, England

[73] Assignee: U.S. Philips Corporation, New York, N.Y.

[21] Appl. No.: 469,654

[22] Filed: Jan. 23, 1990

[30] Foreign Application Priority Data

Feb. 27, 1989 [GB] United Kingdom ............... 8904404

[51] Int. Cl.$^5$ .................. H01L 21/20; H01L 21/265
[52] U.S. Cl. ....................... 437/90; 148/DIG. 26; 148/DIG. 100; 148/DIG. 106; 156/644; 437/31; 437/99; 437/133; 437/962; 437/944
[58] Field of Search ............ 148/DIG. 11, 26, 50, 148/53, 56, 65, 72, 97, 110, 100, 106, 140, 169, 33, 33.3, 33.4, 33.5; 357/16, 55, 56, 34; 156/610–614, 643, 644, 662; 437/31, 81, 89, 90, 99, 108, 126, 133, 912, 947, 962, 944

[56] References Cited

U.S. PATENT DOCUMENTS

| | | | |
|---|---|---|---|
| 4,111,725 | 9/1978 | Cho et al. ......................... | 156/612 |
| 4,149,307 | 4/1979 | Henderson ....................... | 156/652 |
| 4,179,312 | 12/1979 | Keller et al. ...................... | 427/38 |
| 4,499,656 | 2/1985 | Fabian et al. ..................... | 156/647 |
| 4,614,564 | 9/1986 | Sheldon et al. ................... | 156/657 |
| 4,637,129 | 1/1987 | Derkits, Jr. et al. ............... | 156/652 |
| 4,647,339 | 3/1987 | Houghton ......................... | 156/643 |
| 4,728,628 | 3/1988 | Fiddyment et al. ............... | 437/225 |
| 4,897,361 | 1/1990 | Harriott et al. ................... | 437/90 |
| 4,902,643 | 2/1990 | Shimawaki ........................ | 437/89 |
| 4,910,164 | 3/1990 | Shichijo ............................ | 437/90 |

FOREIGN PATENT DOCUMENTS

| | | | |
|---|---|---|---|
| 0125633 | 9/1980 | Japan ................................ | 437/944 |
| 0006834 | 1/1988 | Japan ................................ | 437/944 |
| 0032680 | 2/1989 | Japan ................................ | 437/944 |

Primary Examiner—Olik Chaudhuri
Assistant Examiner—William Bunch
Attorney, Agent, or Firm—Paul R. Miller

[57] ABSTRACT

A semiconductor body (1) is provided by growing epitaxial layers of semiconductor material on a substrate placed within a processing chamber and forming a mesa structure (3) on an upper epitaxial layer (2). The mesa structure (3) is formed by epitaxially growing, with the semiconductor body (1) still within the processing chamber, a first layer (4) of a semiconductor material different from that of the upper layer (2) on the upper layer (2) and the opening a window (5) in the first layer (4) to expose an area (2a) of the upper layer (2). A further layer (6) of a semiconductor material different from that of the first layer (4) is then epitaxially grown on the first layer (4) and on the said area (2a) of the upper layer. The first layer (4) is then selectively etched so as to remove the first layer (4) and the part of the further layer (6) carried by the first layer (14) leaving the remainder (60a, 60b) of the further layer (6) in the window (5) to form the mesa structure (3).

9 Claims, 2 Drawing Sheets

METHOD OF MANUFACTURING A SEMICONDUCTOR DEVICE HAVING A MESA STRUCTURE

This invention relates to a method of manufacturing a semiconductor device having a mesa structure, which method comprises providing a semiconductor body by growing at least one epitaxial layer of semiconductor material on a substrate placed within a processing chamber and forming a mesa structure at an upper epitaxial layer on the substrate by providing a first layer on the upper layer, opening a window in the first layer to expose an area of the upper layer, providing a further layer of semiconductor material on the first layer and in the window, and selectively etching the first layer so as to remove the first layer and the part of the further layer carried by the first layer to form the mesa structure.

U.S. Pat. No. 4,111,725 describes such a method in which the upper epitaxial layer is the only epitaxial layer on the substrate and is provided on a semi-insulating gallium arsenide substrate by molecular beam epitaxy (MBE) as an n conductivity type gallium arsenide layer. The substrate is then removed from the MBE machine and the first layer provided as a thick amorphous layer of, for example, silicon dioxide. After patterning of the first layer to form the window exposing the said area of the upper epitaxial layer, the upper epitaxial layer is etched to form a mesa structure and, after subsequent removal of overhanging portions of the first layer, the substrate is returned to the MBE machine where the further layer is provided as a highly n conductivity type gallium arsenide layer which is polycrystalline on the amorphous first layer. The first layer is then etched away so removing, that is lifting off, the overlying polycrystalline portion of the further layer leaving the mesa structure.

The method described in U.S. Pat. No. 4,111,725 thus requires the use of two separate material deposition machines for the upper epitaxial layer and the first layer and the upper epitaxial layer may be exposed to contamination during the transfer between the machines.

It is an aim of the present invention to provide a method of manufacturing a semiconductor device having a mesa structure which enables the mesa structure to be precisely defined whilst avoiding the need for separate material deposition machines.

According to the present invention, there is provided a method of manufacturing a semiconductor device having a mesa structure, which method comprises providing a semiconductor body by growing at least one epitaxial layer of semiconductor material on a substrate placed within a processing chamber and forming a mesa structure at an upper epitaxial layer on the substrate by providing a first layer on the upper layer, opening a window in the first layer to expose an area of the upper layer, providing a further layer of semiconductor material on the first layer and in the window, and selectively etching the first layer so as to remove the first layer and the part of the further layer carried by the first layer to form the mesa structure, characterised by providing the first layer by epitaxially growing, with the semiconductor body still within the processing chamber, a layer of a semiconductor material different from that of the upper layer on the upper layer, and providing the further semiconductor material layer by epitaxially growing a layer of semiconductor material different from that of the first layer on the first layer and the area of the upper layer.

Thus in a method in accordance with the invention, the first layer is provided as a layer of a different semiconductor material which is selectively etchable relative to the upper epitaxial layer and the further layer so enabling the mesa structure to be precisely defined without having to remove the semiconductor body from the processing chamber in order to form the first layer. The need for two material deposition machines may thus be avoided.

Preferably, the window is opened so that the part of the further layer remaining in the window forms the mesa structure. However, the upper epitaxial layer could be etched after formation of the window so that, following the selective etching to remove the first layer, the upper epitaxial layer stands proud of the remaining part of the further layer and so forms the mesa structure.

In one embodiment, the semiconductor body is provided so that the upper layer forms a doped base region and the further layer is deposited as a first subsidiary layer doped with impurities of the opposite conductivity type to the base region and a second subsidiary layer doped with impurities of the same conductivity type as the base region with the first subsidiary layer being sufficiently thin and highly doped so that the mesa structure forms with the base region a bulk unipolar diode for injection of hot charge carriers into the base region during operation of the semiconductor device. Thus, a method embodying the invention may be used to manufacture a hot charge carrier transistor, for example a hot electron transistor, and, in this case, enables exposure of the relatively thin base region for formation of the base contact without the possibility of overetching of the base region causing the metallisation deposited to form the base contact inadvertently shorting the base region to the underlying collector region of the transistor.

Suitably the first and second subsidiary layers are formed as doped layers of the same material, normally the same material as the upper layer, so simplifying the choice of selective etchant for etching away the sacrificial first layer. For example, the further and upper layers may be formed of gallium arsenide and the first layer of aluminium gallium arsenide in which case a suitable etchant for selectively etching the first layer would be, for example, buffered HF or hydrochloric acid. Where, however, a suitable selective etchant is available the first and second subsidiary layers may, if desired, be formed of different materials so as to define a heterojunction which may be used to increase the height of the barrier defined by the bulk unipolar diode and or to reduce problems such as minority carrier trapping at the barrier.

Figure 3:
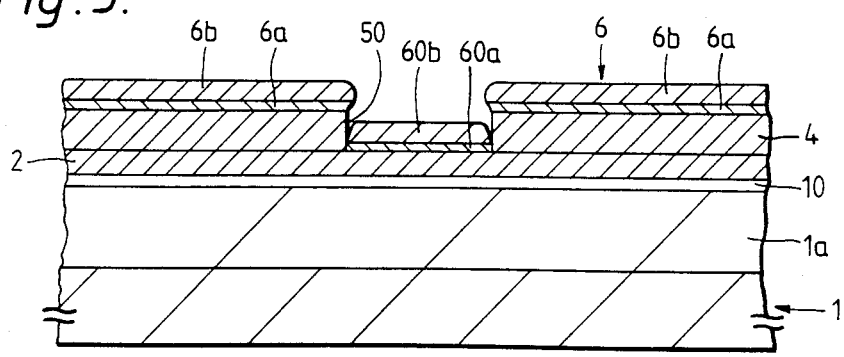
Figure 4:
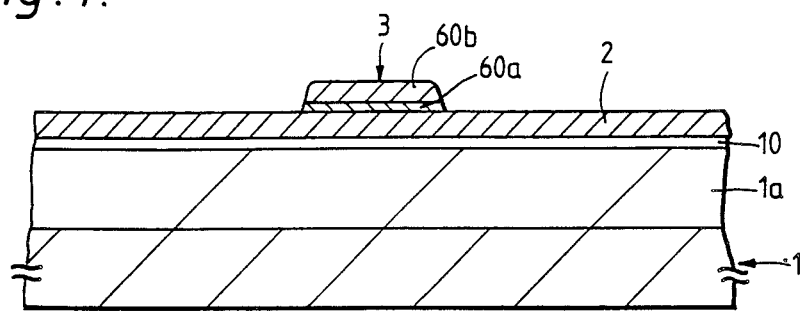
Figure 5:
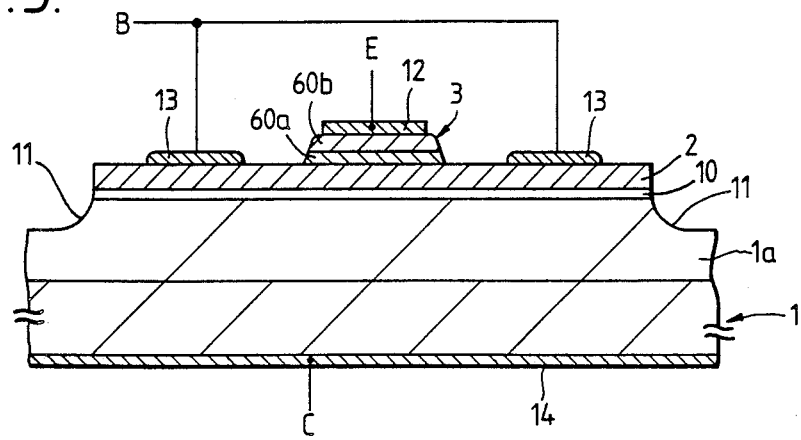
Figure 6:
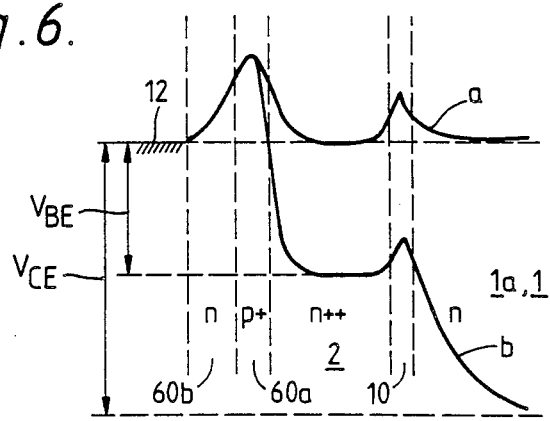

Embodiments of the invention will now be described, by way of example, with reference to the accompanying drawings, in which:

FIGS. 1, 2, 3, 4 and 5 are schematic cross-sectional views illustrating various stages in the manufacture of a hot-charge carrier transistor by a method in accordance with the invention; and FIG. 6 is an energy diagram for the transistor shown in FIG. 5 both under bias and under zero bias.

It should be understood that the Figures are merely schematic and are not drawn to scale. In particular certain dimensions such as the thickness of layers or regions may have been exaggerated while other dimensions may have been reduced. It should also be understood that the same reference numerals are used throughout the Figures to indicate the same or similar parts.

Referring now to the drawings, a method of manufacturing a semiconductor device having a mesa structure comprises providing a semiconductor body 1 by growing at least one epitaxial layer of semiconductor material on a substrate placed within a processing chamber, in this example a molecular beam epitaxy machine, and forming a mesa structure 3 at an upper epitaxial layer 2 on the substrate by providing a first layer 4 on the upper epitaxial layer 2, opening a window 5 in the first layer 4 to expose an area 2a of the upper layer 2, providing a further layer 6 of semiconductor material on the first layer 4 and in the window 5, and selectively etching the first layer 4 so as to remove the first layer 4 and the part 6a of the further layer 6 carried by the first layer 4 to form the mesa structure.

In accordance with the invention, the first layer 4 is provided by epitaxially growing, with the semiconductor body 1 still within the processing chamber, a layer of a semiconductor material different from that of the upper layer 2 on the upper layer 2, and the further semiconductor material layer 6 is provided by epitaxially growing a layer of semiconductor material different from that of the first layer 4 on the first layer 4 and the said area 2a of the upper layer 2.

The first semiconductor layer 4 is thus used as a sacrificial layer which is etchable selectively relative to the upper layer 2 and the further layer 6 so that the first layer 4 and thus the part of the further layer 6 carried by the further layer 6 can be selectively removed. The mesa structure is thus provided precisely where required and the possibility of undesired etching away of the upper layer is avoided or at least reduced. Moreover, the first and further layers are formed using the same processing chamber and, in particular, the first layer is formed without having to remove the semiconductor body from the processing chamber.

Referring now specifically to the embodiment shown in FIGS. 1 to 5, there is illustrated a method in accordance with the invention of manufacturing a hot electron transistor in which the upper layer 2 forms an n conductivity type base region through which current flow is by hot electrons. It should be appreciated that the invention may be used in the construction of a hot hole transistor having opposite conductivity type regions to the corresponding regions of a hot electron transistor. Hot charge carries are those which are not in thermal equilibrium with the lattice. Thus, the average energy of hot electrons is considerably more than a few k.T above the average energy of electrons in equilibrium with the lattice (where k and T are the Boltzmann constant and the lattice temperature respectively). At room temperature k.T is about 25 meV (milli electron volts).

As shown in FIG. 1, the semiconductor body 1 comprises a highly n conductivity type monocrystalline semiconductor substrate, in this example a gallium arsenide substrate, onto which layers are grown or deposited in a conventional molecular beam epitaxy machine using conventional molecular beam epitaxy techniques. The layers comprise a relatively lowly doped n conductivity type gallium arsenide collector layer or region 1a, a collector-base barrier-defining region 10 (shown unhatched in the Figures) and then the base region 2 which in this example is formed of highly n conductivity type gallium arsenide.

The base-collector barrier-defining region 10 may form a bulk unipolar diode of the type described in U.S. Pat. No. 4,149,174 and may be formed of the same bandgap semiconductor material as the base region 2. Thus, the base-collector barrier-defining region 10 may be formed of gallium arsenide and may have a p type impurity concentration the magnitude of which determines the height of the potential barrier to the flow of electrons from the base region 2 to the collector region 1a. The base-collector barrier-defining region 10 is sufficiently thin that the depletion layers formed with the base region 2 and collector region 1,1a merge at zero bias so as to substantially deplete the base-collector barrier-defining region 10. To obtain such depletion under zero bias, the thickness and doping level of the base-collector barrier-defining region 10 should satisfy the conditions laid down in U.S. Pat. No. 4,149,174, the height of the barrier being determined by the doping level of the base-collector barrier-defining region 10.

After formation of the base region 2, the semiconductor body 1 is kept in place in the molecular beam epitaxy (MBE) machine and the first or sacrificial layer 4 is epitaxially grown by molecular beam epitaxy. In this example, the sacrificial layer 4 is formed of aluminium gallium arsenide, that is $Al_xGa_{1-x}As$ where x is typically 0.3. The aluminium gallium arsenide may be doped with p conductivity type impurities as this should normally increase the rate at which the aluminium gallium arsenide is selectively etched relative to the gallium arsenide.

Figure 2:
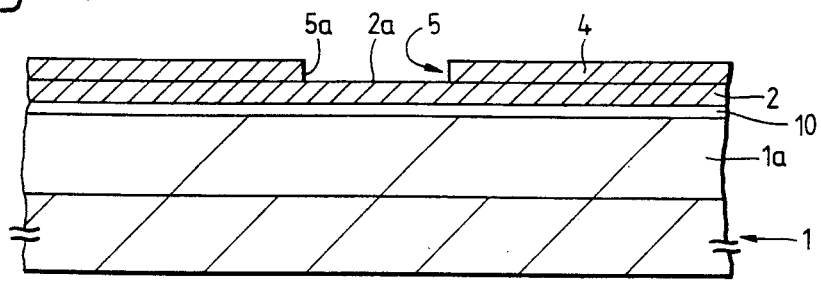

The semiconductor body 1 is then removed from the MBE machine and the window 5 opened using conventional photolithographic and etching techniques to expose, as shown in FIG. 2, the area 2a of the base region 2 where the mesa structure 3 is to be formed.

Upon return of the semiconductor body 1 to the MBE machine, a first subsidiary layer 6a of p conductivity type gallium arsenide is epitaxially grown or deposited followed by a second subsidiary layer 6b of n conductivity type gallium arsenide so as to complete the further layer 6 which, as will be described below, forms with the base region 2 a bulk unipolar diode of the type described in U.S. Pat. No. 4,149,174 for injecting hot electrons into the base region 2.

As can be seen from FIG. 3, the step defined by the edge or side wall 5a of the window 5 in the first or sacrificial layer 4 causes the first and second subsidiary layers 6a and 6b to be formed so that there is a discontinuity at the side wall 5a of the window 5. This effect may be enhanced particularly if the Knudsen sources providing the molecular beams are arranged to direct the beams at an angle to the surface of the sacrificial layer 4 so that the side wall 5a of the window 5 provides a shadow effect. Alternatively or additionally, the sacrificial layer 4 may be etched so that it is undercut so as to assist the formation of a discontinuity at the side wall 5a of the window 5.

The etching of the window 5 may be arranged to produce a slight undercutting so that the side wall 5a defines an angle of less than 90 degrees with the surface of the sacrificial layer 4. The use of MBE to form the further layer 6 enables precise control over the formation of the layer 6 and allows the formation of a break or thin region in the further layer 6 at the side wall or edge 5a to be ensured.

A short isotropic etch may be carried out to remove any slight growth of the gallium arsenide further layer 6 on the side wall 5a of the window so as to ensure that the area or part 50 of the side wall 5a of the aluminium gallium arsenide sacrificial layer 4 is exposed to the subsequent etchant which attacks aluminium gallium arsenide with a high selectivity in comparison to gallium arsenide. Several selective etchants for aluminium gallium arsenide are available and, for example, buffered HF or hydrochloric acid may be used. The selective etchant attacks the aluminium gallium arsenide of the sacrificial layer 4 via the exposed part 50 and eventually completely etches away the aluminium gallium arsenide so lifting off the part of the further layer 6 carried by the sacrificial layer 4 to leave the mesa structure 3 which, as shown in FIG. 4, is thus defined by the remaining portions 60a and 60b of the first and second subsidiary layers 6a and 6b. The use of an etchant selective to aluminium gallium arsenide ensures that the relatively thin base region 2 is not attacked by the etchant while enabling the mesa structure 3 to be precisely defined.

After definition of the mesa structure 3 and exposure of the surrounding base region 2 surface, this area is masked and a mesa or moat 11 etched through the base region 2 into the collector region 1a to isolate the device from others on the same substrate. The termination of this etching process, unlike the formation of the mesa structure 3, is not critical because of the thickness of the collector region 1a. As an alternative to etching the mesa 11, a proton bombardment technique could be used to provide the isolation.

Conventional metal contacts 12, 13 and 14 are provided to contact the mesa structure emitter 3, base region 2 and substrate 1, respectively.

As mentioned above the mesa structure 3 forms with the base region 2 a bulk-unipolar diode of the type described in U.S. Pat. No. 4,149,174 for injecting hot electrons into the base region 2 with the remaining portion 60a of the first subsidiary layer 6a forming the emitter-base barrier-defining region and being sufficiently thin that the depletion layers formed with the base region 2 and the emitter region formed by the remaining portion 60b of the second subsidiary layer 6b merge at zero bias so as to substantially deplete the emitter-base barrier-defining region 60a. To obtain such depletion under zero bias, the thickness and doping level of the emitter-base barrier-defining region 60a should satisfy the conditions laid down in U.S. Pat No. 4,149,174, the height of the barrier being determined by the doping level of the emitter-base barrier-defining region 60a.

In a typical specific example, the collector region 1a may have a thickness of about 1 μm (micrometer) and a dopant concentration of about $10^{16}$ silicon (or tin) atoms cm$^{-3}$ while the collector-base barrier-defining region 10 may have a thickness of about 15 nm (nanometers) and a dopant concentration of about $3 \times 10^{18}$ atoms cm$^{-3}$, the base region 2 may have a thickness of about 25 nm and a dopant concentration of about $5 \times 10^{18}$ silicon atoms cm$^{-3}$, the emitter-base barrier-defining region 60a a thickness of about 20 nm and a dopant concentration of about $3 \times 10^{18}$ beryllium atoms cm$^{-3}$ and the emitter region 60b a thickness of about 400 nm and a dopant concentration of about $10^{16}$ silicon (or tin) atoms cm$^{-3}$.

FIG. 6 is an energy diagram for the transistor shown in FIG. 5 under different bias conditions with the line a indicating the situation under zero bias and the line b indicating the situation with the base region 2 and collector region 1,1a biased relative to the emitter region 60b by voltages $V_{BE}$ and $V_{CE}$, respectively.

Materials other than gallium arsenide and aluminum gallium arsenide and semiconductors other than III-V compounds could be used. Moreover, the emitter-base barrier-defining region 60a could be formed of a different material from the base region 2 so as to form a heterojunction with the base region 2 to, for example, increase the height of the barrier defined by the region 60 a and where the valence band of the material forming the region 60a resides at a higher hole energy then that of the base region 2 so as to reduce minority carrier trapping, provided an appropriate etchant which will selectively etch the sacrificial layer 4 and not the emitter-base barrier-defining region 60a nor the base region 2 is available. Suitable pairs of materials may be, for example, aluminium gallium arsenide and indium gallium arsenide, gallium arsenide and indium gallium arsenide and gallium arsenide and gallium arsenide phosphide with, in each case, an appropriate selective etchant.

Also, a method embodying the invention may be used to manufacture semiconductor devices other than hot charge-carrier devices, being, as indicated above, of particular advantage where the upper layer, on which the mesa structure is to be defined, is relatively thin, for example in the case of permeable base transistors or tunnelling hot electron transistors. Where suitable selective etchants are available enabling the sacrificial layer to be etched selectively relative to the base and to the emitter region, a method embodying the invention may be used to manufacture a heterojunction bipolar transistor. A method in accordance with the invention may also be used, for example to form a waveguide structure or a ridge-type semiconductor laser.

From reading the present disclosure, other modifications will be apparent to persons skilled in the art. Such modifications may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly, whether or not it relates to the same invention whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device having a mesa structure, which method comprises providing a semiconductor body by growing at least one epitaxial layer of semiconductor material on a substrate placed within a processing chamber and forming a mesa structure at an upper epitaxial layer on the substrate by providing a first layer on the upper layer, opening a window in the first layer to expose an area of the upper layer, providing a further layer of semiconductor material on the first layer and in the window, and selectively etching the first layer so as to remove the first layer and the part of the further layer carried by the first layer to form the mesa structure, characterised by providing the first layer by epitaxially growing, with the semiconductor body still within the processing chamber, a layer of a semiconductor material different from that of the upper layer on the upper layer, and providing the further semiconductor material layer by epitaxially growing a layer of semiconductor material different from that of the first layer on the first layer and the said area of the upper layer.

2. A method according to claim 1, further characterised by growing the semiconductor layers in a molecular beam epitaxy machine.

3. A method according to claim 2, further characterised by opening the window so that the part of the further layer remaining in the window after removal of the first layer forms the mesa structure.

4. A method according to claim 3, further characterised by providing the semiconductor body so that the upper layer forms a doped base region and depositing the further layer as a first subsidiary layer doped with impurities of the opposite conductivity type to the base region and a second subsidiary layer doped with impurities of the same conductivity type as the base region with the first subsidiary layer being sufficiently thin and highly doped so that the mesa structure forms with the base region a bulk unipolar diode for injection of hot charge carriers into the base region during operation of the semiconductor device.

5. A method according to claim 4, further characterised by providing the doped base region and the second subsidiary layer as layers of n conductivity type so that the mesa structure forms with the base region a bulk unipolar diode for injection of hot electrons into the base region.

6. A method according to claim 4, further characterised by depositing the first and second subsidiary layers as oppositely doped layers of the same material.

7. A method according to claim 1, further characterised by providing the upper layer and further layer of one III-V semiconductor material and the first layer of a different III-V semiconductor material.

8. A method according to claim 7, further characterised by providing the upper layer and further layer as layers of gallium arsenide and the first layer as a layer of aluminium gallium arsenide.

9. A method according to claim 1, further characterised by providing electrical contacts on the upper layer and the mesa structure.

* * * * *